United States Patent
Zünd et al.

(10) Patent No.: US 8,104,421 B2
(45) Date of Patent: Jan. 31, 2012

(54) VACUUM CHAMBER ON A FRAME BASIS FOR COATING INSTALLATIONS

(75) Inventors: Fredy Zünd, Widnau (CH); Marco Mayer, Schaan (LI); Siegfried Krassnitzer, Feldkirch (AT); Jürgen Gwehenberger, Wangs (CH)

(73) Assignee: Oerlikon Trading AG, Trubbach, Trubbach (CH)

( * ) Notice: Subject to any disclaimer, the term of this patent is extended or adjusted under 35 U.S.C. 154(b) by 620 days.

(21) Appl. No.: 12/259,910

(22) Filed: Oct. 28, 2008

(65) Prior Publication Data

US 2009/0107396 A1 Apr. 30, 2009

(30) Foreign Application Priority Data

Nov. 28, 2007 (DE) .......................... 10 2007 057 644

(51) Int. Cl.
*C23C 16/00* (2006.01)
*F16J 15/02* (2006.01)
(52) U.S. Cl. ........... 118/50; 118/733; 277/630; 277/637
(58) Field of Classification Search .................... 118/50, 118/733, 715; 277/312, 630, 637; 49/475.1, 49/479.1; 204/298.25; 220/677, 680, 681
See application file for complete search history.

(56) References Cited

U.S. PATENT DOCUMENTS

2004/0187781 A1* 9/2004 Takahashi ...................... 118/715
2005/0205012 A1* 9/2005 Jang .............................. 118/719

FOREIGN PATENT DOCUMENTS

DE 9404022 U1 7/1995
JP 60248928 A * 12/1985

OTHER PUBLICATIONS

International Preliminary Report on Patentability for PCT/EP2008/009233 dated Jun. 1, 2010.

* cited by examiner

*Primary Examiner* — Yewebdar Tadesse
(74) *Attorney, Agent, or Firm* — Pearne & Gordon LLP

(57) ABSTRACT

The present invention relates to a vacuum chamber and to its production. According to the invention, the vacuum chamber comprises a frame into which insert plates are placed. The insert plates form together with the frame a closed space in which a vacuum can be created. Preferably, the shell of the frame is extracted from an integrally formed metal piece, with a large portion of material being removed, leading to openings for the insert plates to be created. This has among others the advantage that no welding seams are necessary where the individual plates are inserted.

8 Claims, 10 Drawing Sheets

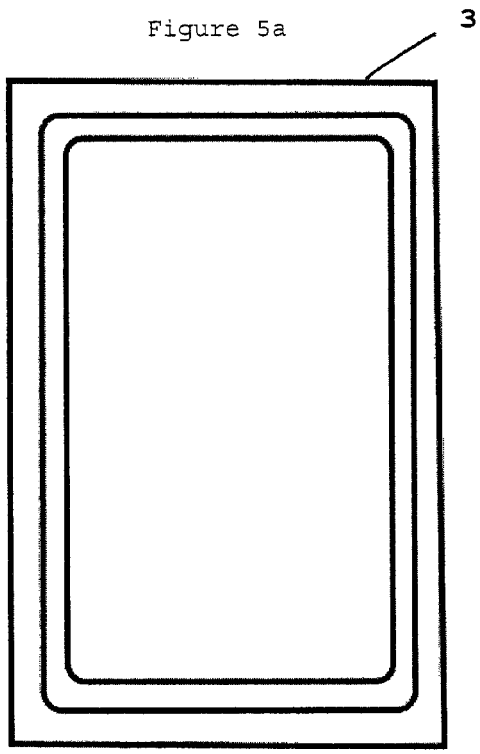
Figure 5a
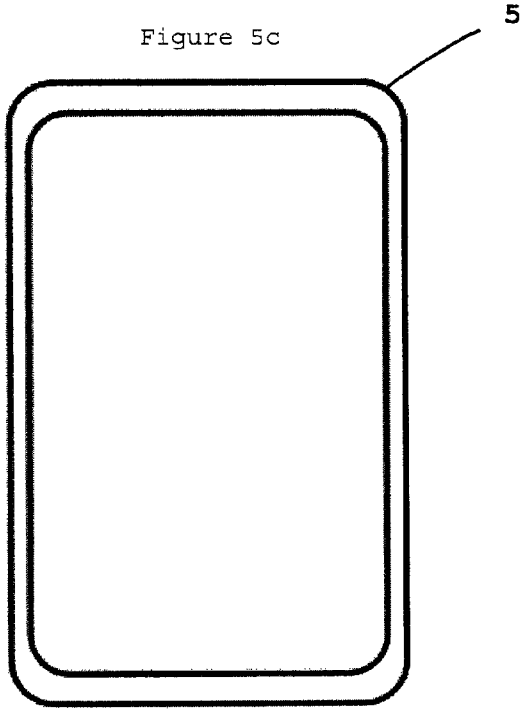
Figure 5c
Figure 5b
Figure 5d
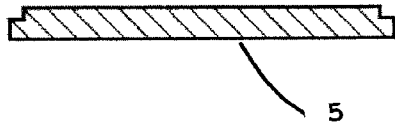

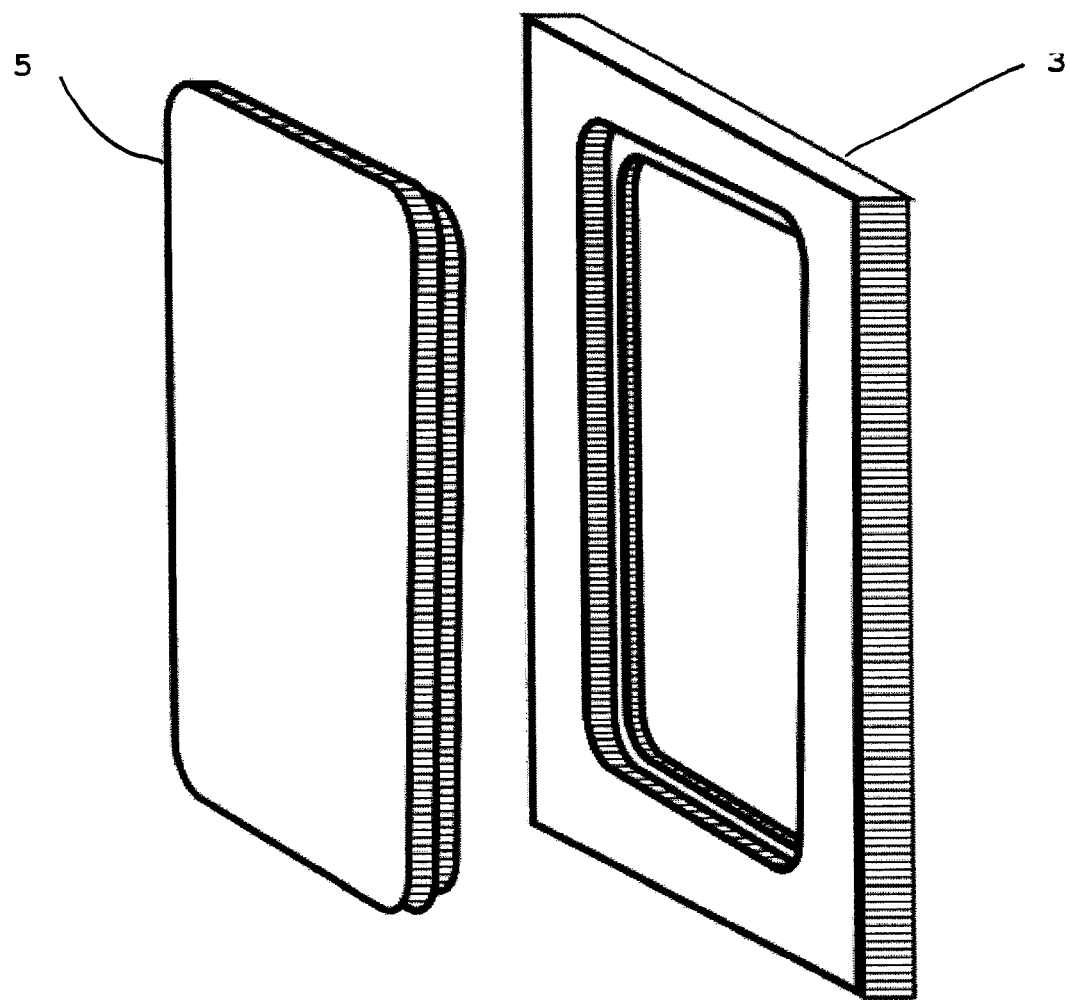

VACUUM CHAMBER ON A FRAME BASIS FOR COATING INSTALLATIONS

The present invention relates to a vacuum chamber. The invention relates in particular to a vacuum chamber for coating installations.

The coating methods known as PVD or CVD designate for instance coating methods under vacuum conditions. In the case of PVD (physical vapor deposition), the coating process is based essentially on physical deposition of material on a work-piece to be coated. In the case of CVD (chemical vapor deposition), the coating method is based essentially on chemical reactions. Both methods have in common that they often take place under high vacuum conditions (HV, $10^{-3}$ mbar to $10^{-7}$ mbar) or under ultra high vacuum conditions (HV, $10^{-7}$ mbar to $10^{-12}$ mbar). In the frame of the present invention, the state of a fluid under vacuum in a volume is to be designated with a pressure that is lower than $10^{-1}$ mbar.

As a general rule, to generate a vacuum a fluid is pumped out of a tightly sealed chamber. The chamber is typically made of an integrally formed chamber body, most often of high-quality steel, in order to prevent possible leaks and create a good vacuum.

DE9404022 addresses the problem that for such conventional chambers made of an integrally formed chamber body, every modification that is to be made is associated with considerable efforts (separation, welding, etc.). It is thus proposed at the outset not to form the vacuum chamber integrally but to separate the function levels (target, source and pump levels) into areas connected with a flange joint. Furthermore, for the purpose of later expansions, the upper and lower closing can occur with flange-connected covers.

This method of dividing the chamber into areas connected with a flange joint has indeed the advantage of an increased flexibility with respect to modifications to be made. This however in the end leads to the necessity, for any modification, of redoing the structural calculations in order to ensure that the chamber formed by the parts connected with a flange joint has the required stability in order to withstand the forces connected with the pressure differences (inside the chamber as compared to outside).

There is thus a need for a vacuum chamber that can be modified in an easy and flexible manner as regards its functional elements, but which is at the same time designed in such a manner that, irrespective of how the functional elements are concretely arranged, a sufficient stability of the chamber is guaranteed.

The task of the invention is thus to fulfill this need, i.e. to provide a vacuum chamber that can be modified in an easy and flexible manner as regards its functional elements, but which is at the same time designed in such a manner that, irrespective of how the functional elements are concretely arranged, a sufficient stability of the chamber is guaranteed.

According to the invention, the task is solved in that the chamber is made as a frame construction in which the insert plates are placed. The frame forms a stable structure for the chamber. It is possible to pre-assemble on the insert plates attachments or in-built devices, such as for example pumps, target or source. The insert plates are connected with the frame mechanically and vacuum-tight. For the manufacture of several different vacuum chambers, frames can be standardized as module in a large number and thus be produced at low cost. In the case of specific customer requirements, the frame no longer needs to be worked upon at all, as the customer specifications can be taken into account completely by adapting the insert plates. The functional elements provided for this purpose, such as for example target, source or vacuum pump, but for example also vision panels, can be arranged from one chamber to the next in a different manner in relation to one another. Since the frame provides the required stability to the chamber, it is not necessary for such a variation to redo the structural calculations every time for the chamber.

The invention will be explained hereinafter in more detail by means of examples and with the aid of figures.

Figure 4A:
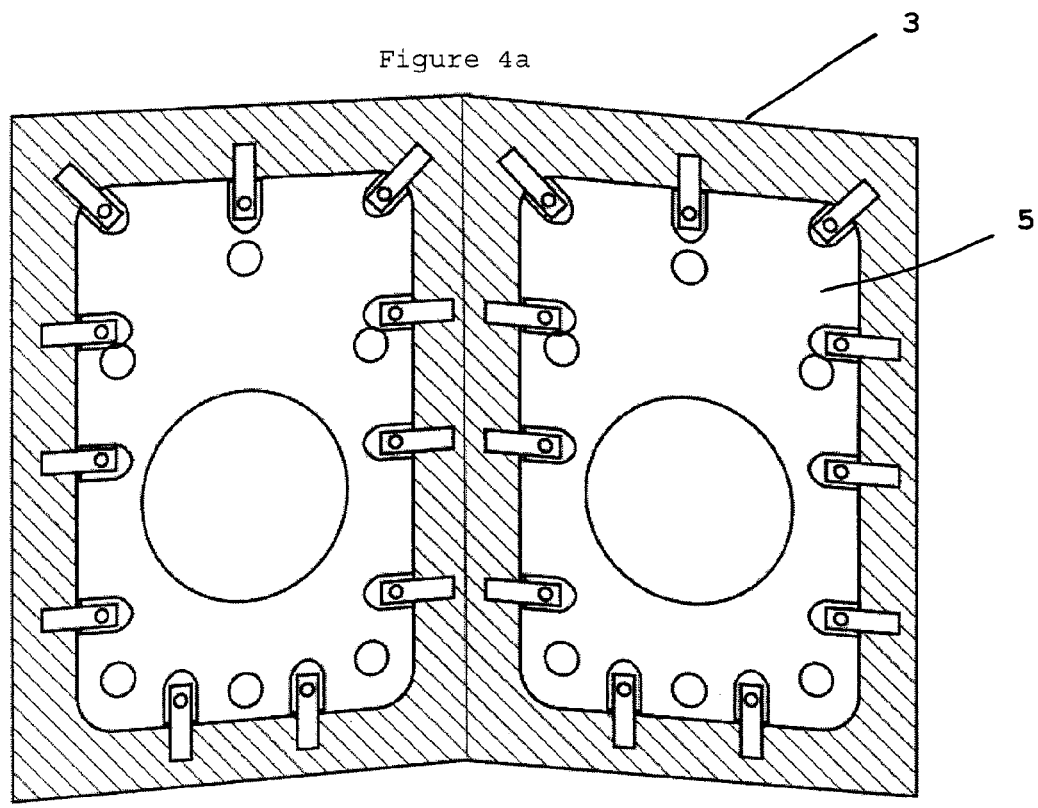

FIG. 4*a* shows part of the inner area of an inventive vacuum chamber.

Figure 4B:
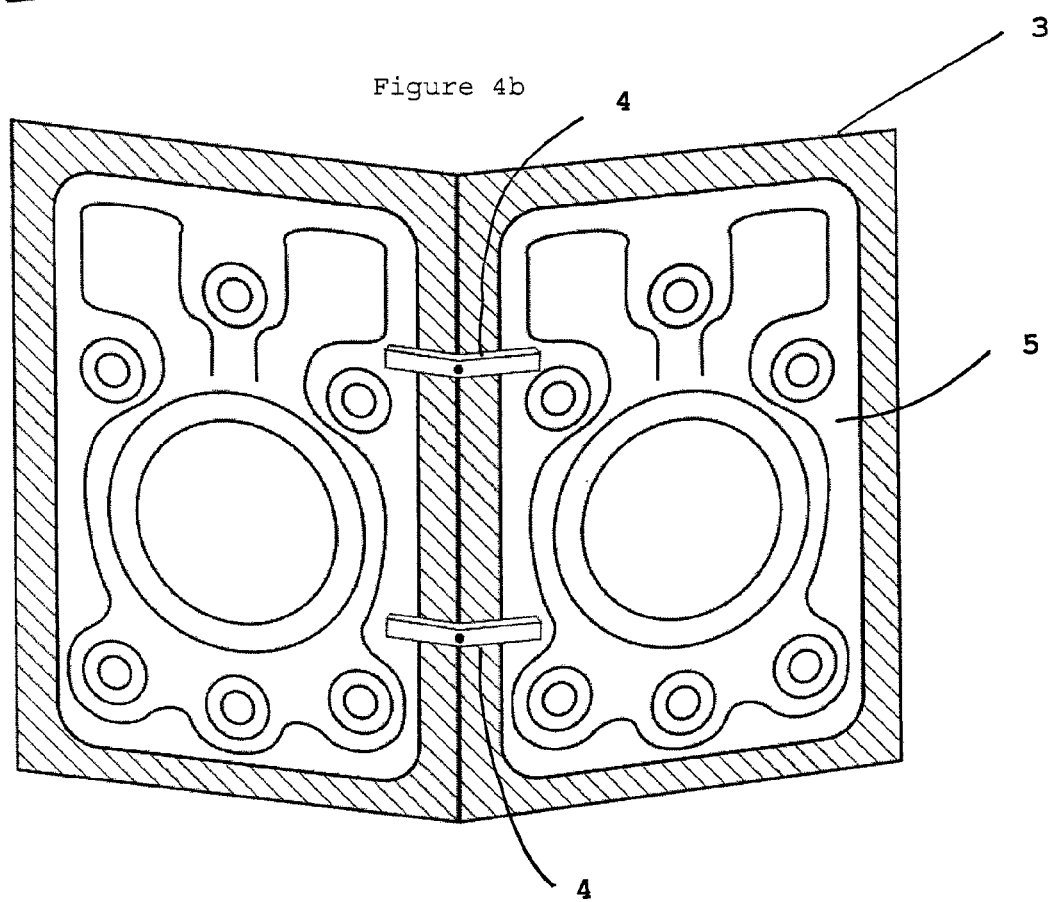

FIG. 4*b* shows the part corresponding to FIG. 4*a* from the outside.

FIG. 5*a* shows the frontal view of a section of the frame of an inventive vacuum chamber.

FIG. 5*b* shows the cross sectional view of the section corresponding to FIG. 5*a*.

FIG. 5*c* shows the frontal view of an insert plate of an inventive chamber.

FIG. 5*d* shows the cross sectional view corresponding to FIG. 5*c*.

FIG. 5*e* shows a perspective view of a section of the frame and of the insert plate of the extract represented in FIGS. 5*a* to 5*d*.

Figure 6A:
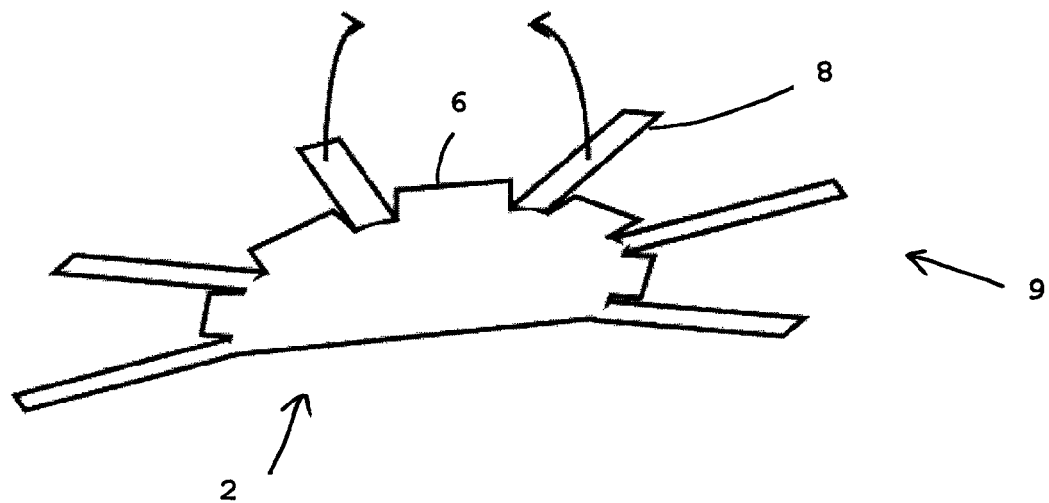

FIG. 6*a* shows diagrammatically a flat form separated from a material plate and that is to be bent to become a constituting element of the frame.

Figure 6B:
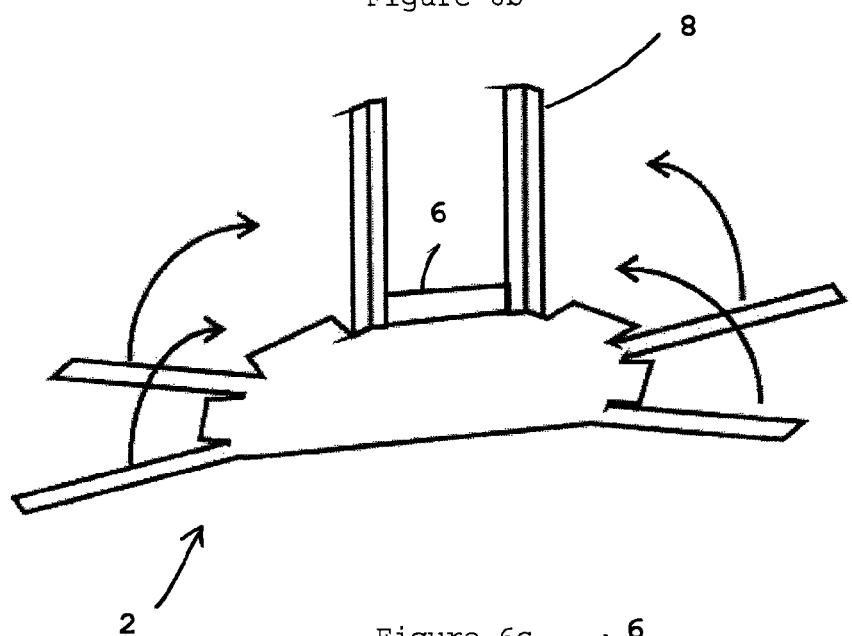

FIG. 6*b* shows the material plate of FIG. 6*a*, where two of the arms have already been bent upwards to form webs.

Figure 6C:
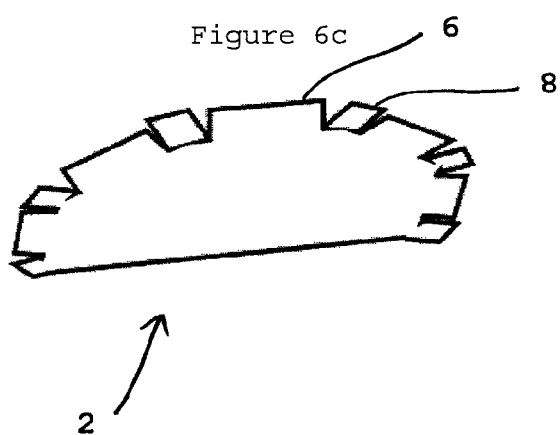

FIG. 6*c* shows the cover, with which the material plate of FIG. 6*b* is connected.

Figure 7:
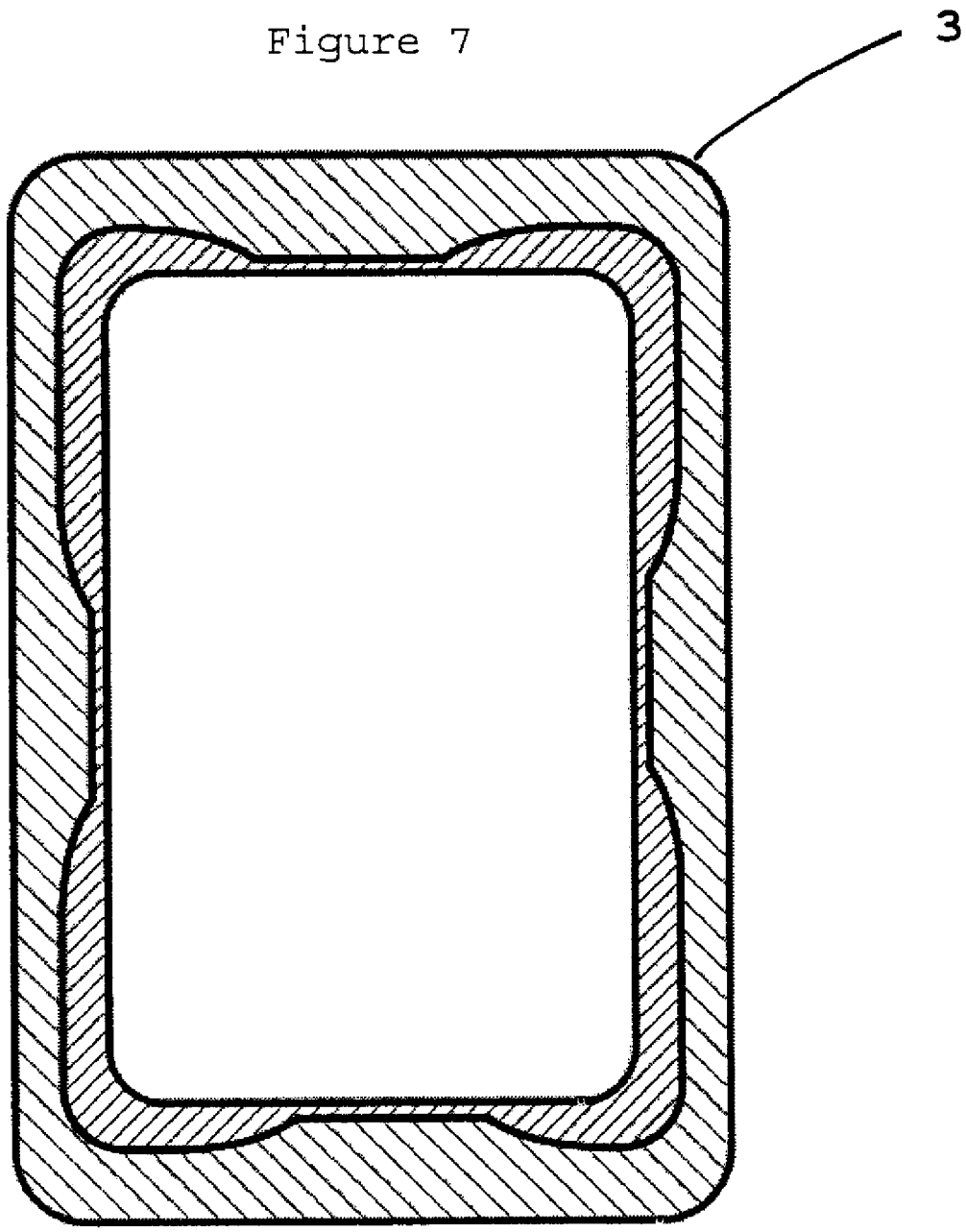

FIG. 7 shows a portion of the frame profile in one embodiment that allows a simple, centered insertion of the insert plate while maintaining stability.

Figure 8A:
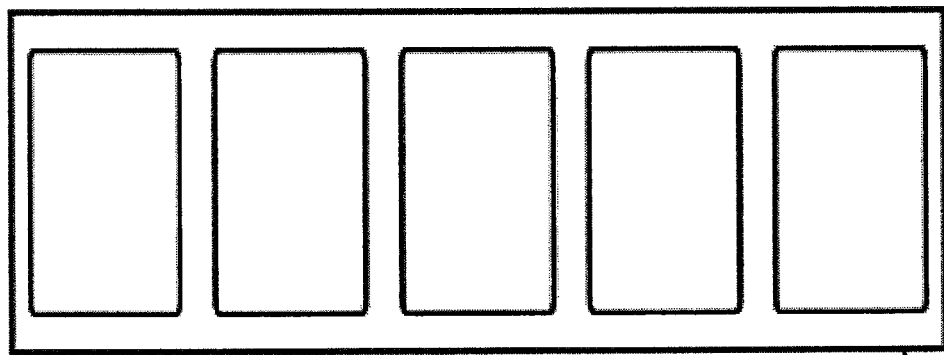

FIG. 8*a* shows a metal plate with openings that can be bent and form part of the outer shell of the chamber frame.

Figure 8B:
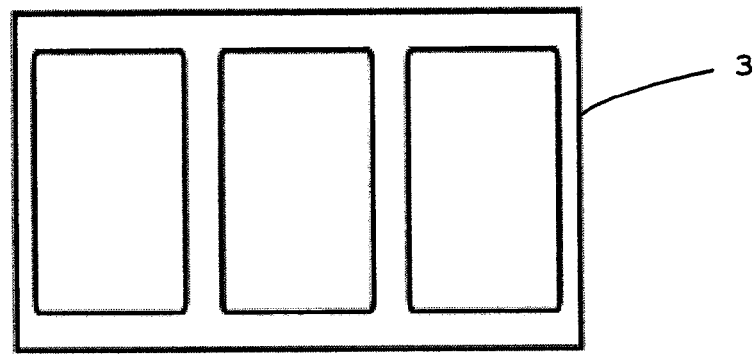

FIG. 8*b* shows a metal plate with openings that can be bent and form part of the doors of the chamber frame.

Figure 9:
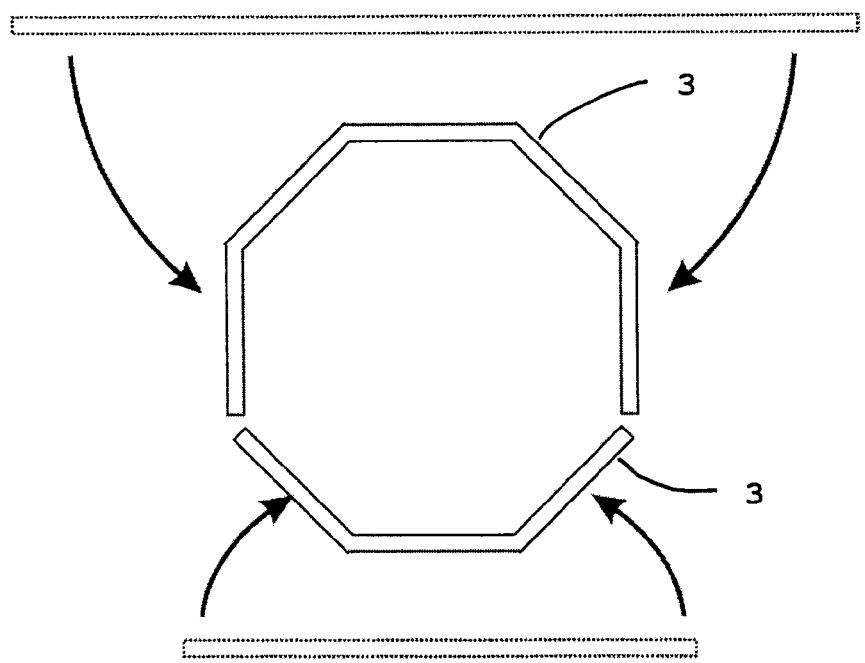

FIG. 9 shows the profiles of the metal plates shown in FIGS. 8*a* and 8*b* and how they can be bent in order to form the outer frame.

Figure 10:
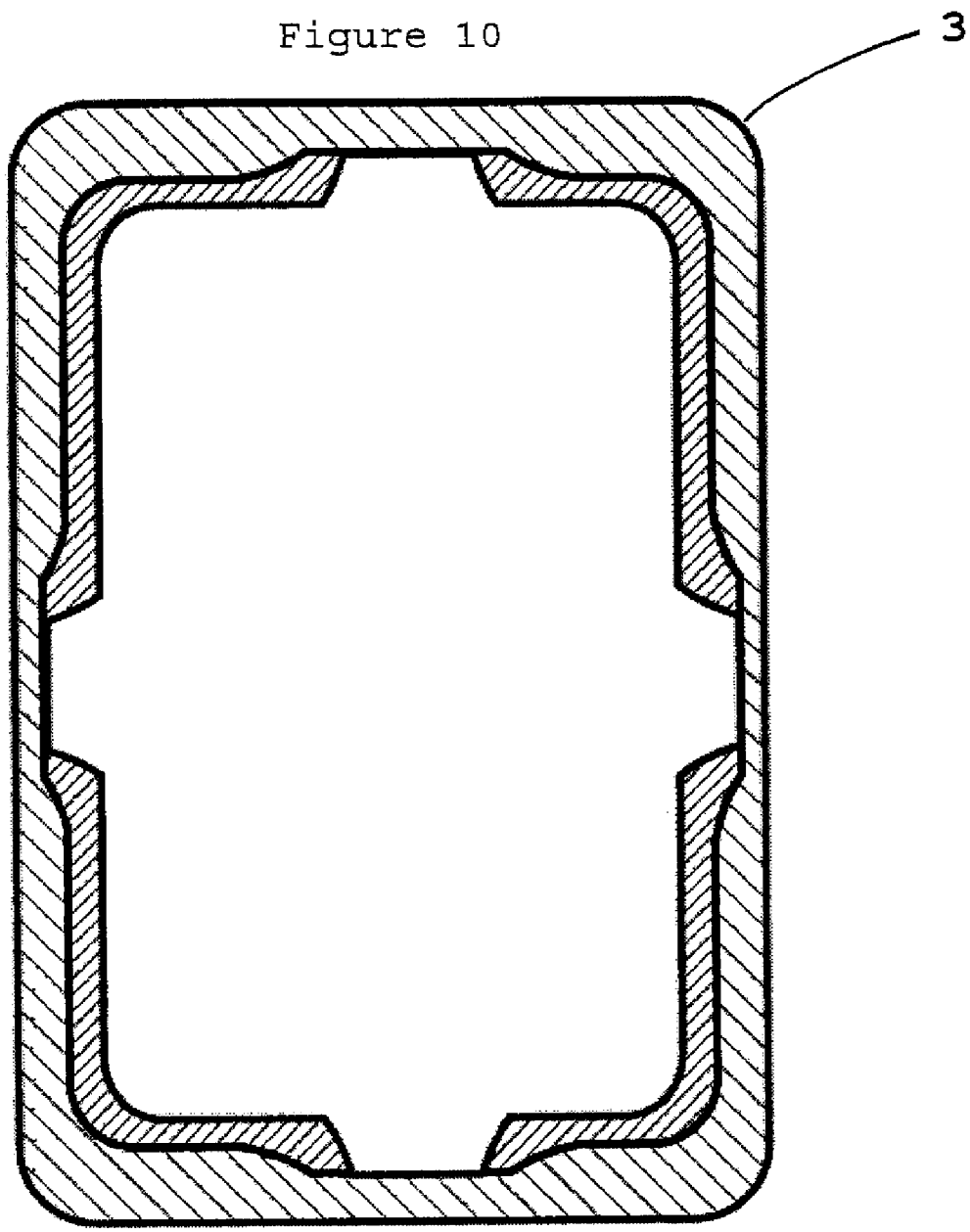

FIG. 10 shows a portion of the frame profile in one embodiment that allows a simple, centered insertion of the insert plate while maintaining stability.

Figure 1:
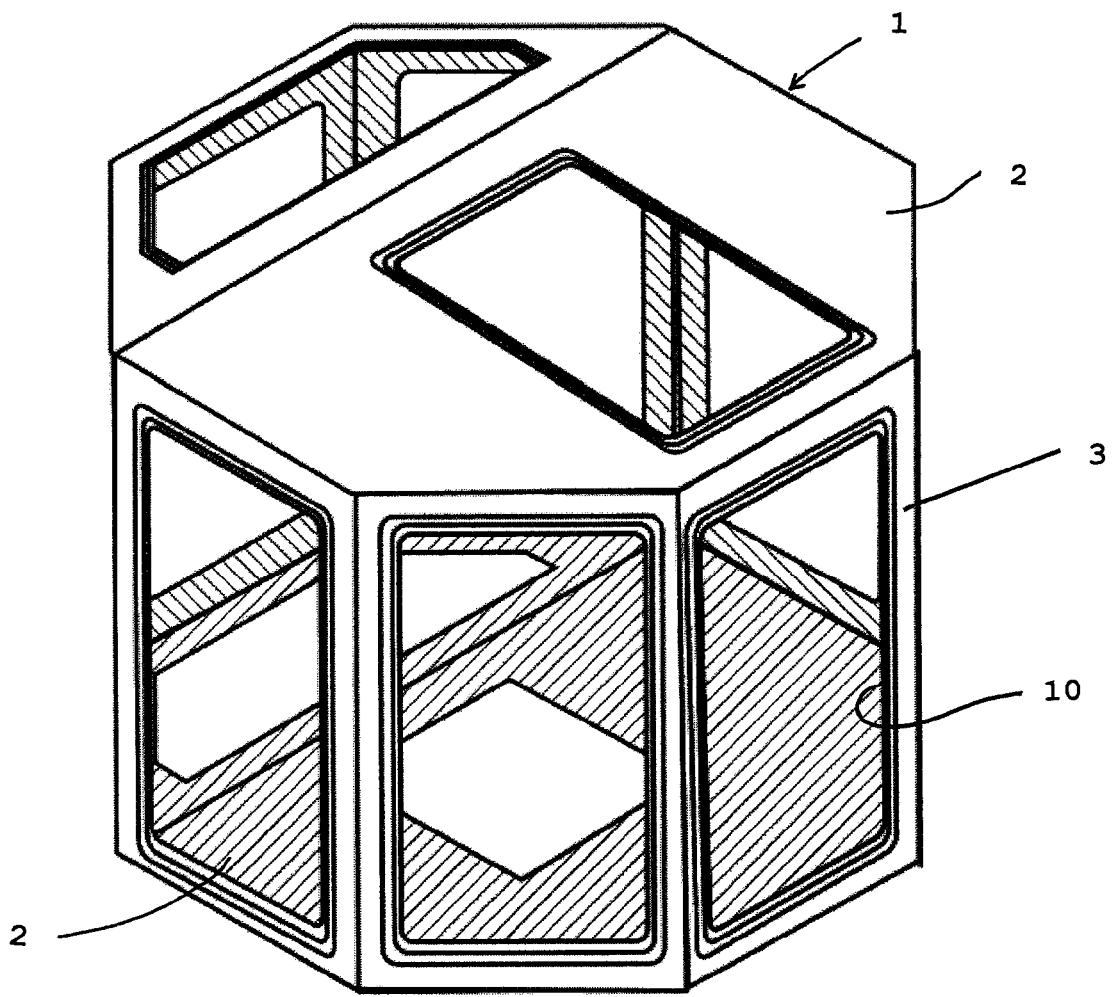
FIG. 1 shows the frame of an inventive vacuum chamber.
Figure 2:
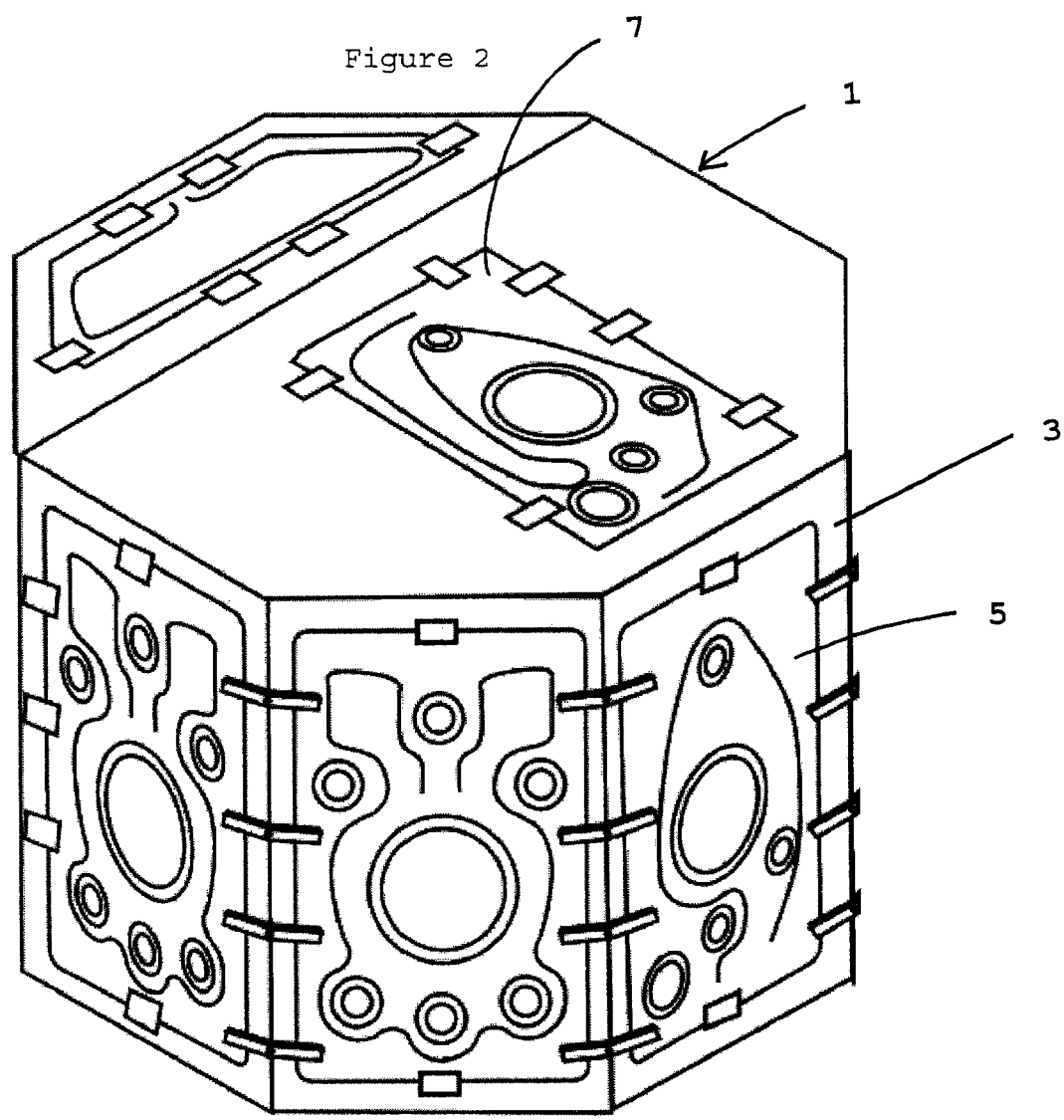
FIG. 2 shows an inventive vacuum chamber with frames according to FIG. 1 and assembled insert plates.
Figure 3:
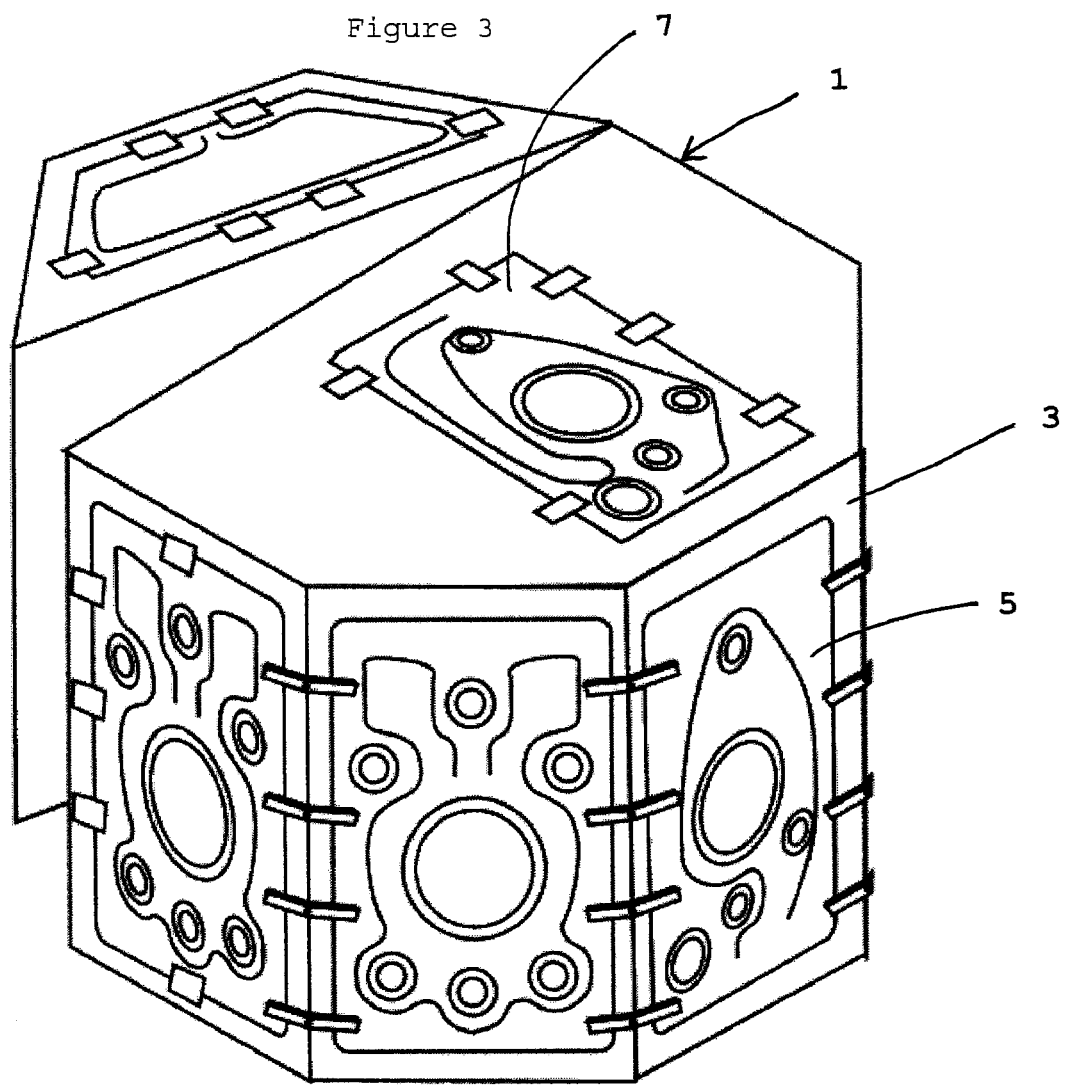
FIG. 3 shows the chamber according to FIG. 2 with slightly opened door.

The example shown in FIG. 1 relates to a regular prism whose base element 2 is a regular octagon. It is possible in this case to speak of a frame since for the outer cover of the prism, material is provided only at the edges of the outer cover and is designed as connecting webs. The connecting webs connect the base element of the prism. The frame is capable of absorbing and withstanding tensile, compression and bending loads, which occur in vacuum chambers for example during evacuation. Additional loads can have their origin in a loaded carousel, strain from the chamber transport for example through lifting tugs. Because of the frame construction, large-size openings 10 arise into which, as is shown in FIG. 2, insert plates 5 can be placed. According to FIG. 1, large-size openings 10 are additionally provided in the base elements 2. Insert plates 7 are also placed there. This is also represented in FIG. 2, which shows an embodiment of a complete inventive vacuum chamber 1. It is merely hinted at in FIG. 2 that the vacuum chamber 1 has a foldable door. As a variant of this embodiment, several doors are also possible. An inventive vacuum chamber 1 with an open door is represented in FIG. 3.

Such a door makes it possible on the one hand to equip the chamber with work pieces that are to be subjected to a vacuum treatment. However, what is relevant in connection with the present invention is that the door makes it possible to assemble the insert plates from outside and to fasten them to the frame from inside.

FIG. 4a accordingly shows a section of the chamber's interior space with a part of the frame 3 on which insert plates 5 are fastened in a mechanically removable fashion. In the present example, the insert plates 5 are bracketed by means of clamps to the frame 3.

The edge profile of the insert plates is adapted to the edge profile of the frame, in such a manner that a first surface of the insert plates fits through the opening formed through the frame whilst the second surface opposite the first surface does not fit through the opening formed by the frame. This can for example be achieved through a stair-shaped profile, as represented in FIGS. 5a to 5d. FIG. 5a shows the frontal view of a portion of the frame 3 whilst FIG. 5b shows the corresponding cross sectional view. FIG. 5c shows the frontal view of an insert plate 5 and FIG. 5d the corresponding cross sectional view. FIG. 5e shows a perspective view of a section of the frame 3 and of the insert plate 5. Structures possibly provided in the insert plates, such as flanges with holes or channels for heating or cooling, are not shown in FIGS. 5a to 5e, since the representation concerns the profile and the interaction of frame and insert plate. The stair-shaped profile allows sealing O-rings, which are typically made of an elastic material, to be provided in the steps. It is possible to provide such O-rings either in the steps of the insert plates or in the steps of the frame, or in both. Other sealing means known to the one skilled in the art can also be used.

For production reasons, among others, as well as to allow an easy placing of the insert plates, it is advantageous to leave some play between the frame and the insert plates. Approximately 4 mm are thus possible and preferable. However, in order to provide additional stability to the frame and thus to the chamber, it is possible to provide thickening areas in the frame, onto which the insert plates can be placed with greater accuracy. These serve not only to stabilize but also to help during adjustments, in particular when centering the insert plates. FIG. 7 shows an example of such thickened, stabilizing and centering areas. In FIG. 7, these are represented in exaggerated form for the purposes of illustration.

A further embodiment is represented diagrammatically in FIG. 10. Here, for example, four recesses are made in the frame 3. The insert plates on the other hand have four moldings that can be placed aligned in the frame when the insert plates are inserted. One advantage of such an embodiment is furthermore that in this case, the edge banding of the openings provided in the frame can first be fashioned without the recesses with a wide tolerance and the recesses can subsequently be made more accurately, i.e. with a narrower tolerance. The same applies for the edge banding of the insert plates and for the insert plates provided therefor.

Represented here is merely the principle. It is also possible to provide such means for stabilization on the insert plates. Stabilization in the framework of this description means the consolidation of the chamber. It is however important for all this that the insert plates seal the chamber's interior space air-tight.

FIG. 4a shows the part of the inner part of a vacuum chamber 1 corresponding to FIG. 4b as seen from outside. The support bracket 4 represented in FIG. 4b is an alternative to the inner bracket embodiment in FIG. 4a. It can however also be bracketed from the outside and from the inside.

The examples chosen for describing the present invention are merely to illustrate the latter, the framework of the invention is however in no way to be limited to these examples.

For example, it is also possible to make chambers that have several doors. It is also possible to make such chambers that are top loading or bottom loading. This is particularly interesting when chamber heights need to be achieved that are considerably over 1.5 m. If such a for instance 3 m high chamber is made with only one frame, the stability of the webs reaches a critical point and the frame threatens to bend under the outer pressure. This can be prevented by providing, for example at half the chamber's height, an additional stabilizing closed polygon that surrounds the entire radial circumference of the chamber. Alternatively, it is possible to provide to the bent shell additional stiffening ribs (e.g. struts/braces/trusses as in a bridge), in order to ensure stability and maintain the advantage of the easy shell.

Attention must be drawn to the fact that instead of providing a closing insert plate at one of the holes formed by the frame, it is possible to arrange a further frame for example through an adapter element and in this manner increase the chamber also sideways.

The present invention also has the advantage, as shown in FIG. 6a for example, that essential constituting elements of the frame 3 can be made from an integrally formed material plate. For this, the base element 2 of the frame 3 with a number of arms 8 corresponding to the webs 9 of the frame 3 is extracted. Between the arms 8, flanges 6 are provided. This is represented diagrammatically in FIG. 6a. The arms are then subsequently bent upwards. The flanges are also bent upwards. The situation where not all arms 8 have been completely bent upwards and only one flange 6 has been bent upwards is represented in FIG. 6b. The lateral edges of the flanges are welded vacuum-tight with the webs. The stability of the resulting webs can be increased in that they are bent longitudinally to the direction of the webs and for example have a sharp bend running longitudinally. Steel sheet or a metal plate, for example, are suitable materials.

To finish the frame, it is only necessary to connect a cover element with the ends of the arms that have become webs, for example by welding. The cover element can in this case essentially have the same shape as the base element, though the arms have been shortened to flanges. This is shown in FIG. 6c. FIGS. 6a to 6c show the part of the frame 3 that constitutes 5 holes for insert plates and enables a door to be mounted. The frame of the door can be made in analogous manner.

According to a somewhat modified method, the shell of the chamber is formed from a first metal plate and a second metal plate constituting the doors. The width of the plates in this case corresponds approximately to the height of the chamber. The openings to be provided for the insert plates are cut out from the metal plates. This has the advantage that no welding seams are necessary where the insert plates are fitted. In the example as represented in FIG. 8a, 5 openings are provided for the first metal plate, which does not form the door. In the example represented in FIG. 8b, three openings are provided for the second metal plate, which forms the door.

In a further step, the plates are bent according to the shape of the shell of the chamber. In FIG. 9, both metal plates are represented in profile in unbent form in dotted line and after bending with a continuous line. The arrows indicate the direction of bending. For a chamber up to 1.5 meters high, a plate thickness of 10 mm up to 30 mm is suitable. Under 10 mm, there is a risk that the stability of the frame is not sufficient for the pressure resulting from the vacuum. Over 30 mm, it is difficult to bend the sheet according to the specifications. Ideally, a plate thickness of approximately 15 mm is used.

To complete the chamber frame, the bottom and the cover are affixed to the shell, for example by welding, and the door is fastened, for example with hinges. This is not represented in the figure. By placing the insert plates in the openings provided in the shell and/or in the bottom and/or in the cover, the chamber is formed.

A vacuum chamber for coating installations has been described wherein the functional elements are arranged on the chamber and characterized in that the chamber comprises a chamber frame and the insert plates are placed in the frame in a mechanically removable fashion and vacuum-tight and several of the insert plates bear functional elements.

A vacuum chamber for coating installations has also been described wherein the functional elements are arranged on the chamber, wherein the chamber comprises a chamber frame and the insert plates are placed in the frame in a mechanically removable fashion and vacuum-tight and several of the insert plates bear functional elements, characterized in that the chamber frame has at least one base element formed integrally from a metal plate and is provided with arms, wherein the arms are bent in the area of their connection to the base element in such a manner that they form the webs of the chamber frame.

Preferably, at least 40%, particularly preferred at least 50%, of the surface of the volume surrounded by the chamber is delimited by the insert plates.

According to one embodiment of the vacuum chamber, the functional elements and the insert plates are connected in a removable fashion with flange joints, preferably by means of brackets provided. Particularly preferred are brackets provided only on the insert plates.

According to one embodiment of the inventive vacuum chamber, at least some, preferably all the functional elements and the insert plates are connected in a mechanically removable fashion with flange joints.

The assembly of the chamber is particularly flexible when at least two, preferably several openings formed by the frame have geometrically essentially the same shape and thus two, preferably several insert plates can be exchanged by being mechanically removed and fastened in their position.

The insert plates are not necessarily flat plates. Flat plates are however to be preferred in the connection area to the frame. The insert plates can however also be flange-mounted in the shape of pots (curved outside/inside).

The frame gains particular stability when it essentially has a n-fold symmetry in relation to one axis, where n is an integer greater than 2 and insert plates are placed in a fashion corresponding to the symmetry of the frame.

To be preferred are variant embodiments with 6-, 8- or 10-fold symmetry.

Furthermore, a method for making a vacuum chamber has been disclosed, wherein a base element provided with arms is extracted from a material plate for making the frame and the arms are bent out of the plane of the plate in such a manner that they are suitable for forming the webs of the frame and then a cover plate that is, if necessary, degraded to a frame is connected with the webs and wherein insert plates and if necessary one or several doors are placed in the holes that have arisen through the frame, where all together build a closed space that can be evacuated. This applies particularly also for the alternative embodiment according to FIG. 8.

Finally, some possibilities are indicated that can be realized with the present invention. For example, small threaded holes in the shell frame are not necessary for fastening the insert plates. By bending the shell surfaces, a welding seam in the area of the insert plates can be avoided.

It is possible, as a variant embodiment, to provide cut-outs in the shell surface for functional structural components, for example without the insert plate concept but according to the same bracket system as described here above. Furthermore, several chambers can be interconnected, for example through the bracket system. In this manner an installation platform can be created.

Furthermore, an insert plate can also be made as a door in order to fulfill several functions—such as heating, coating for example—per side. As material for the frame, not only high-quality steel can be considered. For example, aluminum alloys can also be used, which leads to reduced material costs and to a reduction in weight.

Alternatively or additionally to the bent shell, additional stiffening ribs, e.g. struts/braces/trusses as in a bridge, can be provided in order to ensure stability and maintain the advantage of the easy shell

The invention claimed is:

1. Vacuum chamber for coating installations, wherein the vacuum chamber is an air-tight vacuum chamber and comprises a frame and insert plates placed in the frame in a mechanically removable fashion and tightly, characterized in that the frame has at least one base element and arms formed integrally from a single metal plate, wherein the arms are bent upward to form webs of the frame.

2. Vacuum chamber according to claim 1, characterized in that at least 40% of the surface of the volume surrounded by the vacuum chamber is delimited by the insert plates.

3. Vacuum chamber according to claim 1, characterized in that the frame and the insert plates are connected in a removable fashion with flanges.

4. Vacuum chamber according to claim 1, characterized in that at least two openings formed by the frame have geometrically essentially the same shape and thus at least two of the insert plates can be exchanged by being mechanically removed and fastened in their position.

5. Vacuum chamber according to claim 1, characterized in that the insert plates at least in the connection area with the frame are flat plates.

6. Vacuum chamber according to claim 1, characterized in that the frame essentially has a n-fold symmetry in relation to one axis, where n is an integer greater than 2 and insert plates are placed in a fashion corresponding to the symmetry of the frame.

7. Vacuum chamber according to claim 1, characterized in that at least 50% of the surface of the volume surrounded by the vacuum chamber is delimited by the insert plates.

8. Vacuum chamber according to claim 1, characterized in that the frame and the insert plates are connected in a removable fashion with flanges by means of brackets provided on the insert plates.

\* \* \* \* \*